United States Patent [19]

Shimoji

[11] Patent Number: 5,543,338
[45] Date of Patent: Aug. 6, 1996

[54] METHOD FOR MANUFACTURING A SEMICONDUCTOR DEVICE USING A SEMICONDUCTOR-ON-INSULATOR SUBSTRATE

[75] Inventor: Noriyuki Shimoji, Kyoto, Japan

[73] Assignee: Rohm Co., Ltd, Kyoto, Japan

[21] Appl. No.: 441,305

[22] Filed: May 15, 1995

Related U.S. Application Data

[63] Continuation of Ser. No. 254,668, Jun. 6, 1994, abandoned, which is a continuation of Ser. No. 57,672, May 5, 1993, abandoned.

[30] Foreign Application Priority Data

Jul. 8, 1992 [JP] Japan ................................. 4-181208

[51] Int. Cl.$^6$ ................................................. H01L 21/335
[52] U.S. Cl. .................. 437/41; 437/29; 437/45; 437/56; 148/DIG. 150
[58] Field of Search .................. 437/41, 26, 29, 437/45, 915, 41 CS, 4 S, 56–58; 148/DIG. 150

[56] References Cited

U.S. PATENT DOCUMENTS

| 3,775,191 | 11/1973 | McQuhae . | |
|---|---|---|---|
| 4,080,718 | 3/1978 | Richman | 437/41 |
| 4,210,465 | 7/1980 | Brower . | |
| 4,364,167 | 12/1982 | Donley . | |
| 4,737,471 | 4/1988 | Shirato et al. | 437/44 |
| 4,845,047 | 7/1989 | Holloway et al. | 437/45 |
| 4,889,820 | 12/1989 | Mori | 437/29 |
| 5,006,479 | 6/1991 | Brandewie | 437/45 |
| 5,024,965 | 6/1991 | Chang et al. | 437/57 |
| 5,028,552 | 7/1991 | Ushiku | 437/41 |
| 5,112,764 | 5/1992 | Mitra et al. | 437/40 |
| 5,144,390 | 9/1992 | Matloubian . | |
| 5,316,960 | 5/1994 | Watanabe et al. | 437/40 |

FOREIGN PATENT DOCUMENTS 4-5832  1/1992  Japan ........................... 437/29

OTHER PUBLICATIONS

Wolf et al, "Silicon Processing For The VLSI Era, vol. 1, Process Technology, Lattic Press", 1986, pp. 280–327.

Primary Examiner—T. N. Quach
Attorney, Agent, or Firm—Cushman, Darby & Cushman

[57] ABSTRACT

An insulated semiconductor area (10a) and an insulated semiconductor area (10b) are provided in the substrate, and a gate electrode (16a) and a gate electrode (16b) is formed above the insulated semiconductor areas (10a) and (10b), respectively. After masking the semiconductor area (10a), boron atoms are implanted via such a beam that the boron atoms can be injected selectively into only the semiconductor area under the gate electrode (16b) in order to create a channel region (20b). Furthermore, the arsenic atoms are implanted via such a second beam that the arsenic atoms are injected selectively into only the semiconductor area except the semiconductor area under the gate electrode (16b) in order to create a source (22b) and a drain (22b).

6 Claims, 7 Drawing Sheets

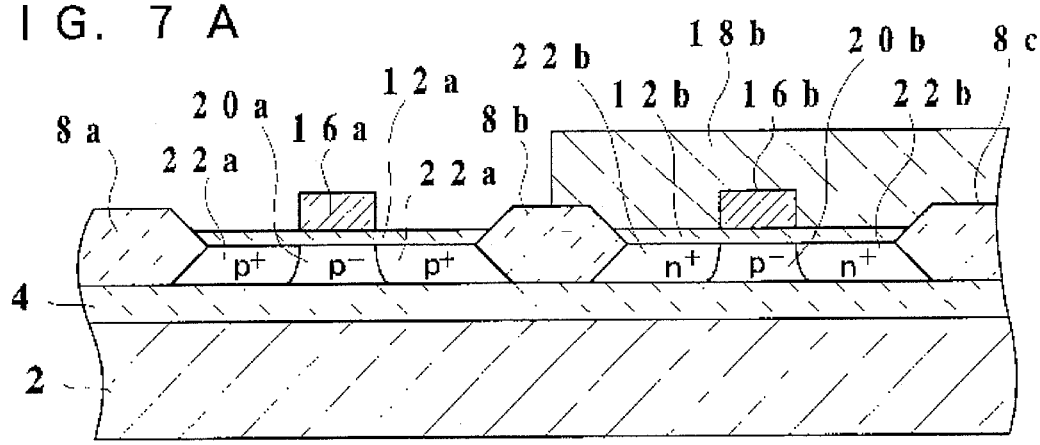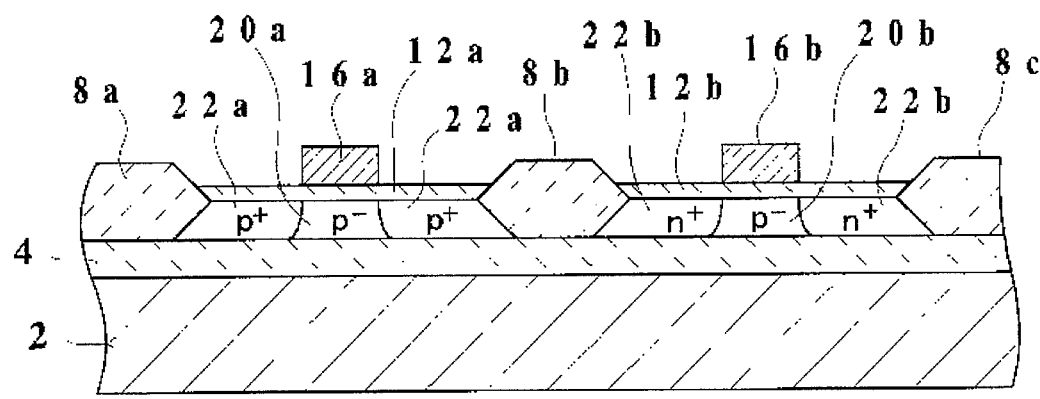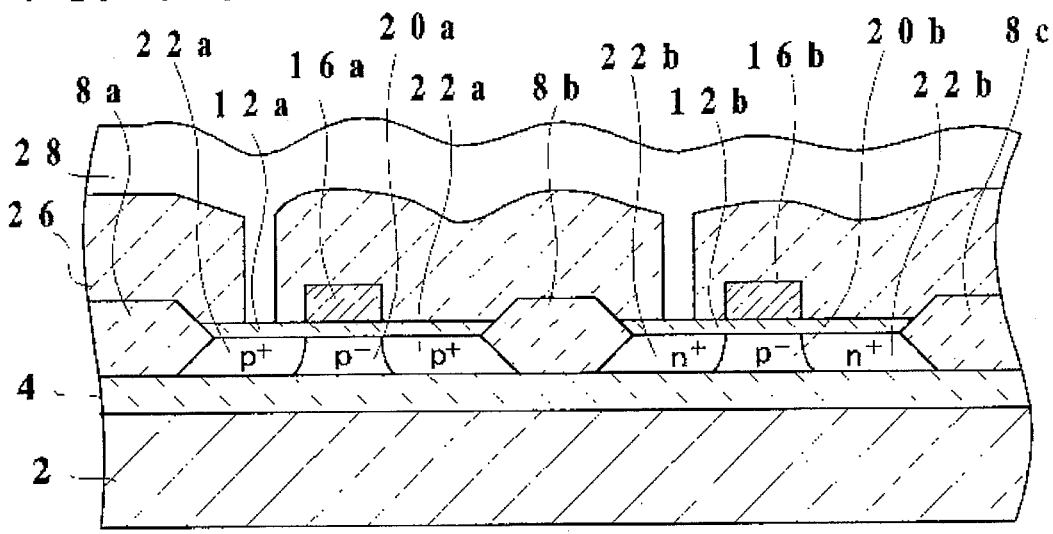

METHOD FOR MANUFACTURING A SEMICONDUCTOR DEVICE USING A SEMICONDUCTOR-ON-INSULATOR SUBSTRATE

This is a continuation of application Ser. No. 08/254,668, filed on Jun. 6, 1994, abandoned, and which was a continuation of application Ser. No. 08/57,672 filed May 5, 1993, abandoned.

BACKGROUND OF THE INVENTION

1. Field of the Invention

The present invention relates to the semiconductor device field and, more particularly, to a method for manufacturing a semiconductor device using an SOI (semiconductor on insulator) substrate.

2. Description of the Prior Art

In a method for manufacturing semiconductor devices, a substrate of monocrystalline silicon is provided with semiconductor elements by using a process of introducing a dopant of a Group III or Group V element into the silicon substrate.

This ion implantation technique is known as a method for creating a diffusion region. Since this technique has advantages in adjusting dopant density and depth of diffusion, it is well used to the manufacture of semiconductor devices.

A method for manufacturing a semiconductor device, specifically a CMOS (complementary metal oxide semiconductor) type transistor, using an ion implantation technique is described herein.

A SIMOX (separation by implanted oxygen) substrate is prepared as shown in FIG. 1A which is a SOI (semiconductor on insulator) substrate. The SIMOX substrate has a structure where an oxide layer 4 is applied on a substrate 2 and a semiconductor layer 6 is applied on the oxide layer 4.

Referring to FIG. 1B, field oxide layers 8a, 8b and 8c are formed in the semiconductor layer 6 by a Local Oxidation of Silicon (LOCOS) technique to divide the silicon substrate into the plural insulated islands 10a and 10b, and gate oxidation layers 12a and 12b are formed on the island 10a and 10b by thermal oxidation.

To adjust the threshold voltage of a transistor to be manufactured to a predetermined value, a dosage of dopant needs to be injected into a channel region which is to be in the insulated islands. Assume that a NMOS (N-channel metal oxide semiconductor) type transistor and a PMOS (P-channel metal oxide semiconductor) type transistor which are of different kinds are provided on the silicon substrate. Then, ion implantation is implemented using two respective resist pattern masks. Referring to FIG. 1C, after a resist pattern 40 covers what is to be an PMOS type transistor, the substrate is subjected to an ion implantation step to create a channel region 20 of P- type with a predetermined threshold as shown in FIG. 2A. Removing the resist pattern 40, a resist pattern 42 covers what is to be a NMOS type transistor (FIG. 2A), and then the substrate is subjected to an ion implantation step to create a channel region 21 of P-type with a predetermined threshold voltage (see FIG. 2B). The resist pattern 42 then is removed.

Next, after a cleaning step, a conductive layer of polysilicon is applied on the entire surface of the substrate. After forming a resist pattern on the conductive layer, the conductive layer is etched by using a resist pattern (not shown) as a mask to form gate electrodes 16a and 16b. Then the resist pattern is removed (see FIG. 2C).

Next, ion implantation is implemented to create sources and drains. This ion implantation is applied to each of the NMOS type transistor and the PMOS type transistor using two respective masks. Specifically, referring to FIG. 3A a resist pattern 44 is applied to what is to be the PMOS type transistor, and then the substrate is subjected to an ion implantation step to create an N+ source 22 and an N+ drain 22. Furthermore, referring to FIG. 3B, after removing the resist pattern 44, a resist pattern 46 is applied to what is to be the NMOS type transistor, and then the substrate is subjected to an ion implantation step to create a P+ source 23 and a P+ drain 23. Then the resist pattern 46 is removed (see FIG. 3C).

However, a method for manufacturing a semiconductor device using two such ion implantation steps has the following problems.

As is described above, the two ion implantation steps are not able to be performed truly successively. A step of forming the gate electrodes 16a and 16b must be implemented between the two ion implantation steps. That is, the two ion implantation steps cannot be performed with a single resist pattern. Therefore, the operations are complicated because the resist pattern must be replaced.

Also, a device for ion implantation is different from that for forming the gate electrode. Therefore, the operations are complicated because the silicon substrate is moved from one device to another.

SUMMARY OF THE INVENTION

An object of the present invention is to provide a method for manufacturing a semiconductor device where a channel region, a source and a drain for an element is formed using a single resist pattern as a mask in successive steps.

According to an embodiment of the present invention, a method for manufacturing a semiconductor device using a SOI (semiconductor on insulator) substrate comprises the steps of:

a) forming a gate electrode above a semiconductor area provided with an element, b) implanting a dopant of a first conductivity type into the substrate via a first beam so that the dopant is injected into at least a semiconductor area under the gate electrode, and c) implanting a dopant of a second conductivity type into the substrate via a second beam so that the dopant is injected into at least a semiconductor area except the semiconductor area under the gate electrode.

According to another embodiment of the present invention, a method for manufacturing a semiconductor device using a SOI substrate comprises the steps of:

a) forming a gate electrode above a semiconductor area which is provided with an element, b) implanting a dopant of a first conductivity type into the substrate using a resist pattern as a mask via a first beam so that ions are injected into at least a semiconductor area under the gate electrode, and c) implanting a dopant of a second conductivity type into the substrate using the resist pattern as a mask via a second beam so that ions are injected into at least a semiconductor area except the semiconductor area under the gate electrode.

While the novel features of the invention are set forth in a general fashion, particularly in the appended claims, the invention, both as to organization and content, will be better understood and appreciated, along with other objects and features thereof, from the following detailed description taken in conjunction with the drawings.

BRIEF DESCRIPTION OF THE DRAWINGS

FIGS. 7A through 7C are schematic cross-sectional views showing a method for manufacturing an embodiment of the present invention.

DESCRIPTION OF THE PREFERRED EMBODIMENT

There will be described a method for manufacturing a semiconductor device, specifically a NMOS type transistor with reference to the accompanying figures.

Figure 1:
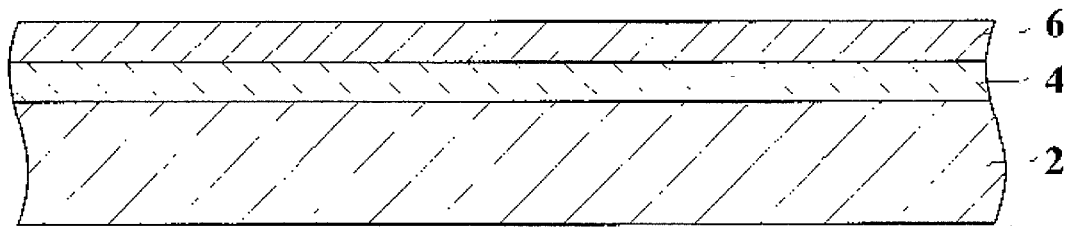
FIGS. 1A through 1C are schematic cross-sectional views showing a method for manufacturing a semiconductor device according to a conventional technique.
Figure 1:
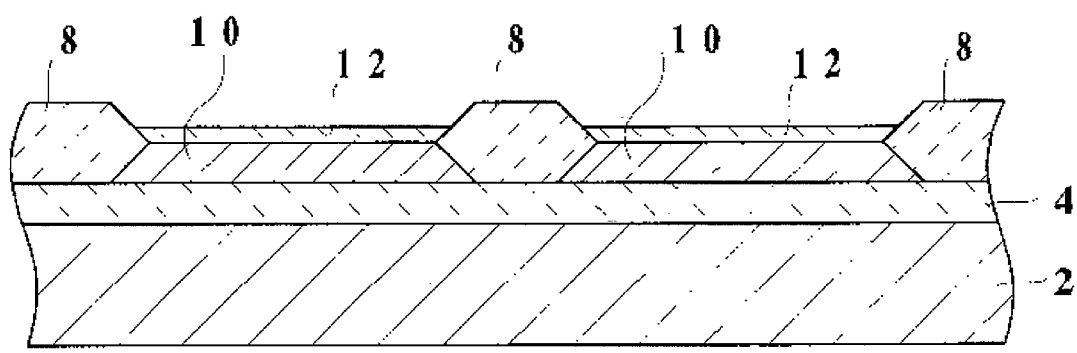
Figure 1:
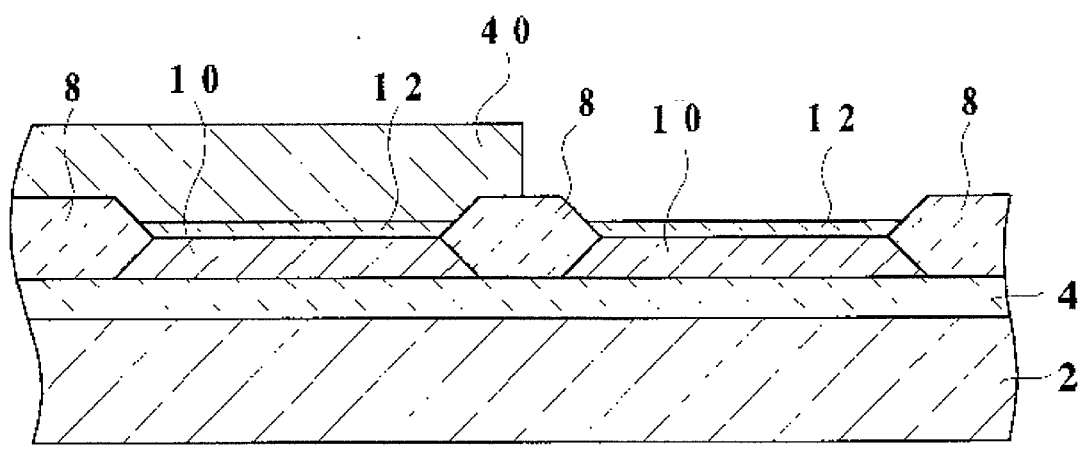
Figure 2:
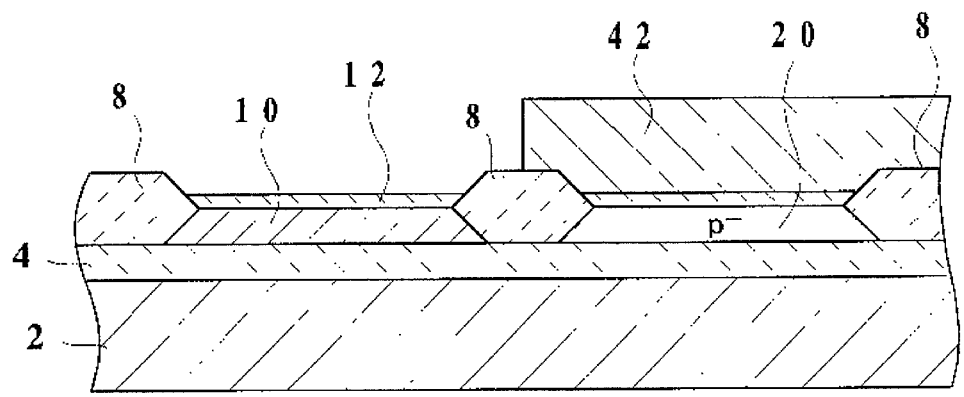
FIGS. 2A through 2C are schematic cross-sectional views showing a method for manufacturing the conventional semiconductor device.
Figure 2:
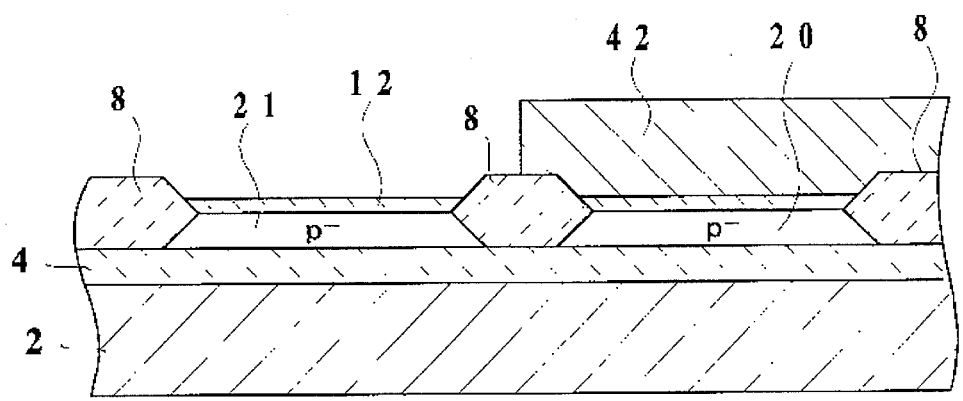
Figure 2:
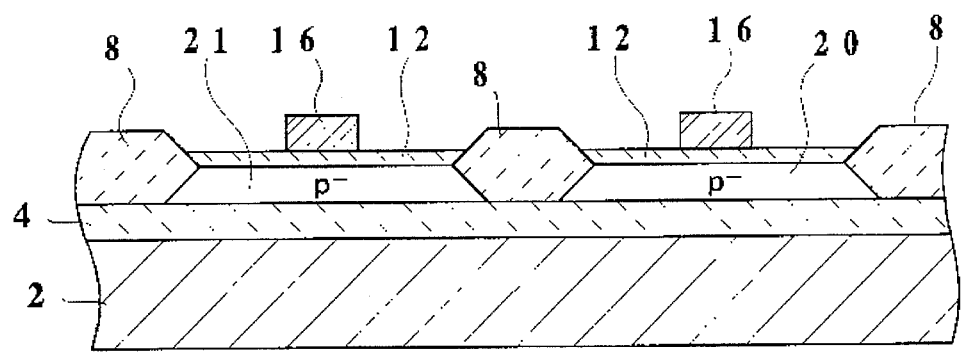
Figure 3:
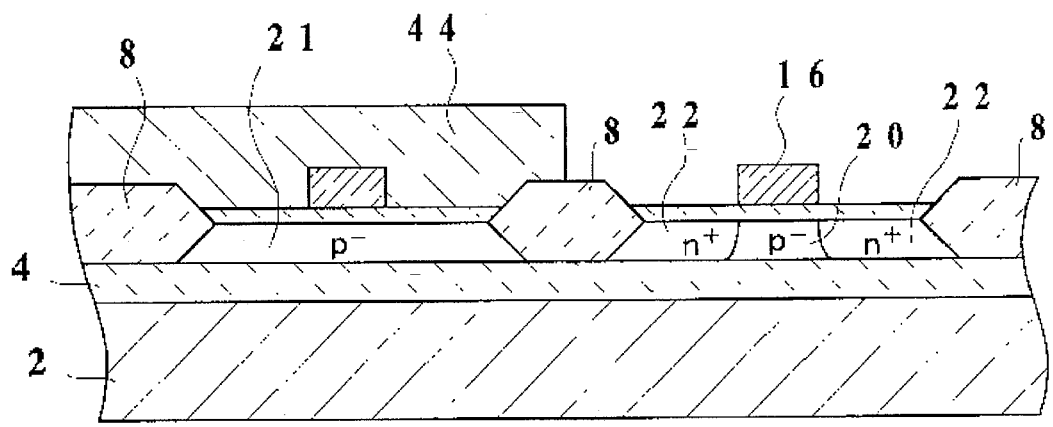
FIGS. 3A through 3C are schematic cross-sectional views showing a method for manufacturing the conventional semiconductor device.
Figure 3:
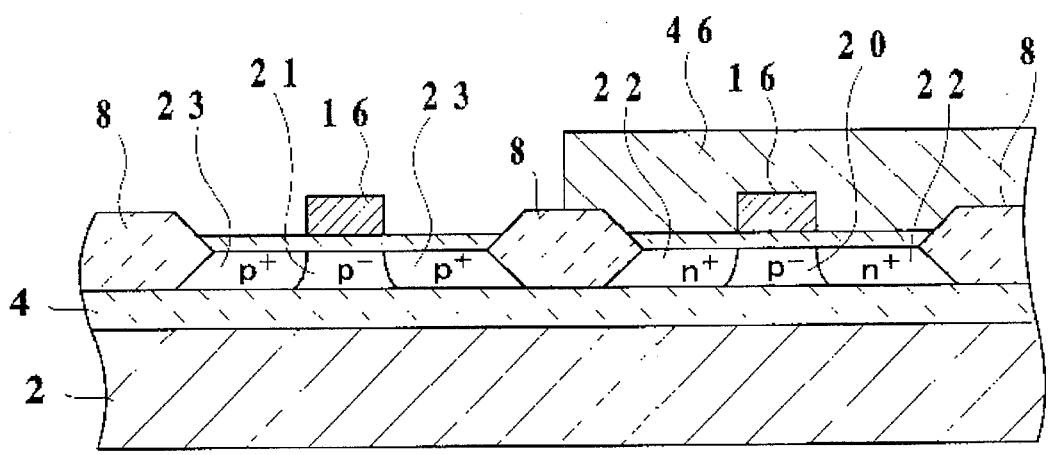
Figure 3:
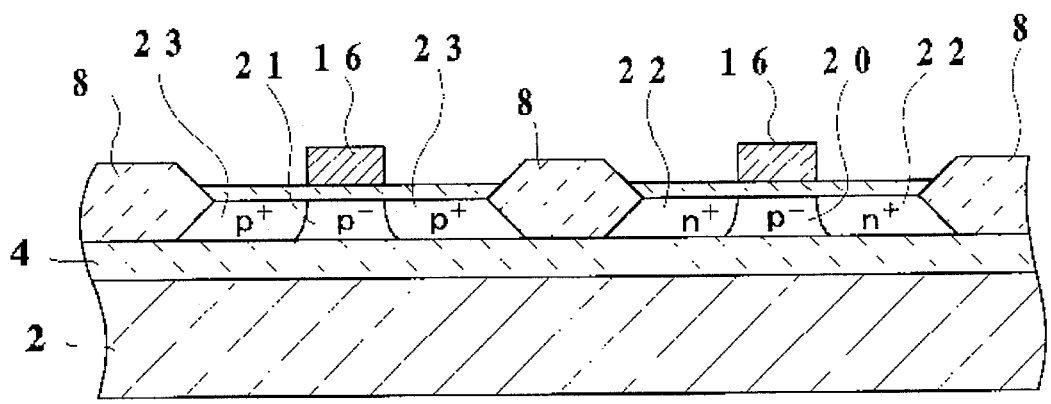
Figure 4:
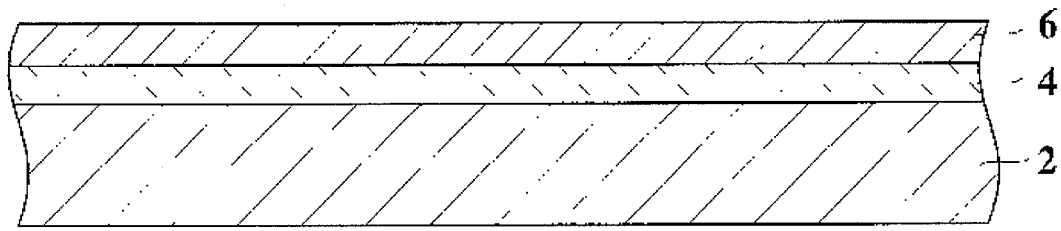
FIGS. 4A through 4C are schematic cross-sectional views showing a method for manufacturing a semiconductor device according to an embodiment of the present invention.
Figure 4:
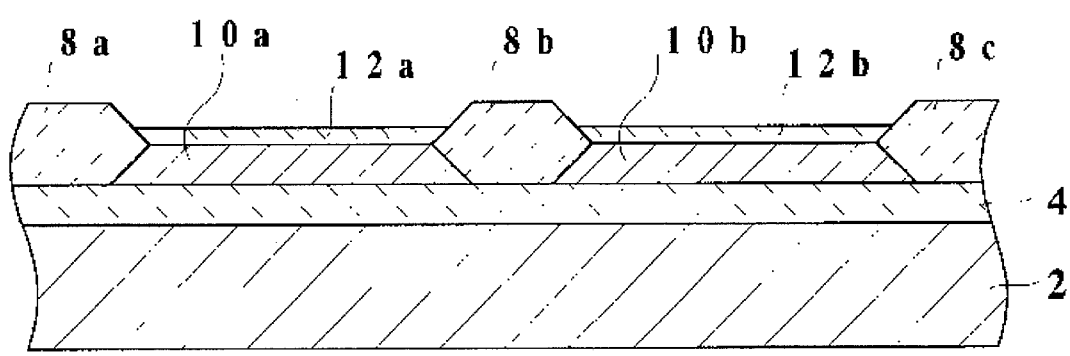
Figure 4:
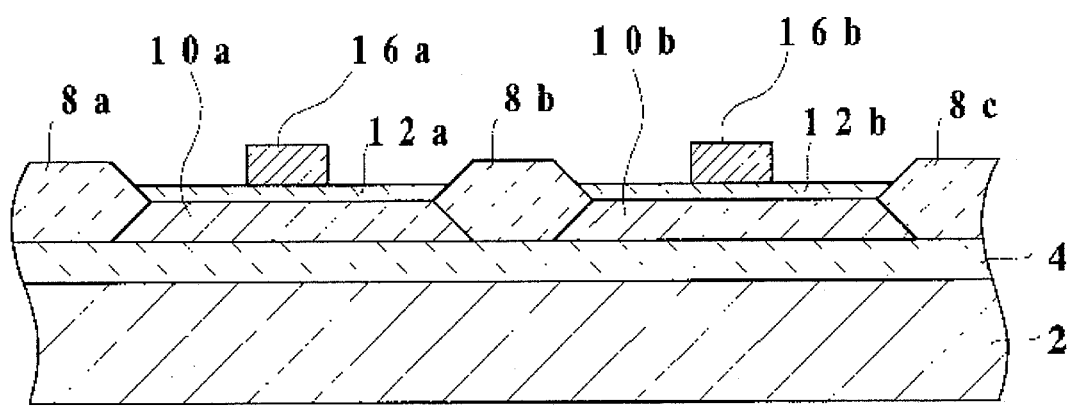

Referring to FIG. 4A, a SIMOX substrate of a SOI substrate is prepared which has a silicon oxide layer 4 of 350 nm thick formed on the entire surface of a substrate 2 of silicon and a silicon crystalline layer 6 of 100 nm thick formed on the entire surface of the silicon oxide layer 4.

Referring to FIG. 4B, field oxide layers 8a, 8b and 8c of 300 nm thickness are formed in the surface of the SIMOX substrate by a Local Oxidation of Silicon (LOCOS) technique to divide the SIMOX substrate into a plurality of insulated semiconductor areas 10a and 10b, and gate oxidation layers 12a and 12b 15 nm thick are formed on the semiconductor areas 10a and 10b by thermal oxidation.

After a layer of polysilicon 400 nm thick is formed on the entire surface of the SIMOX substrate by a chemical vapor deposition (CVD) technique, a resist pattern (not shown) is formed on the layer of polysilicon. Thereafter, after the layer of polysilicon is etched by using the resist pattern as a mask to form gate electrodes 16a and 16b, the resist pattern is removed (see FIG. 4C). Next, the substrate is subjected to a step of creating a source, a drain and a channel region to provide, for example, an NMOS type transistor. The step will be described below with reference to the accompanying figures.

Figure 5:
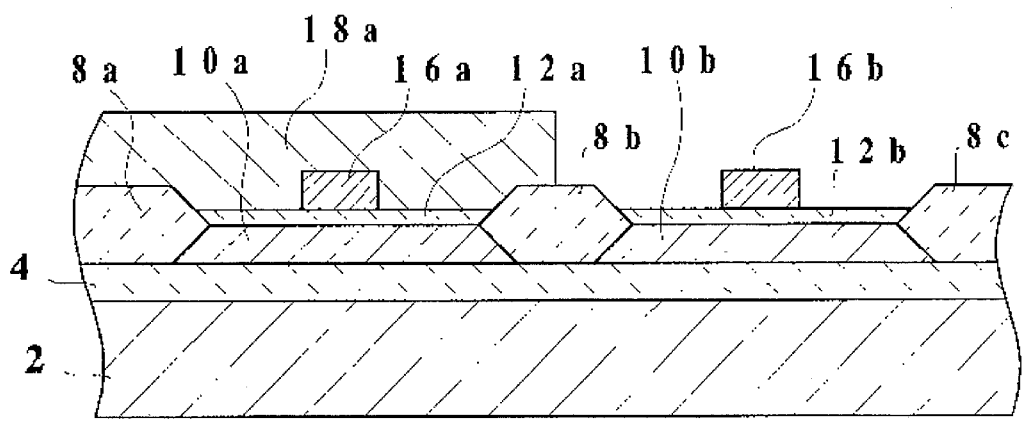
FIGS. 5A through 5C are schematic cross-sectional views showing a method for manufacturing an embodiment of the present invention.
Figure 5:
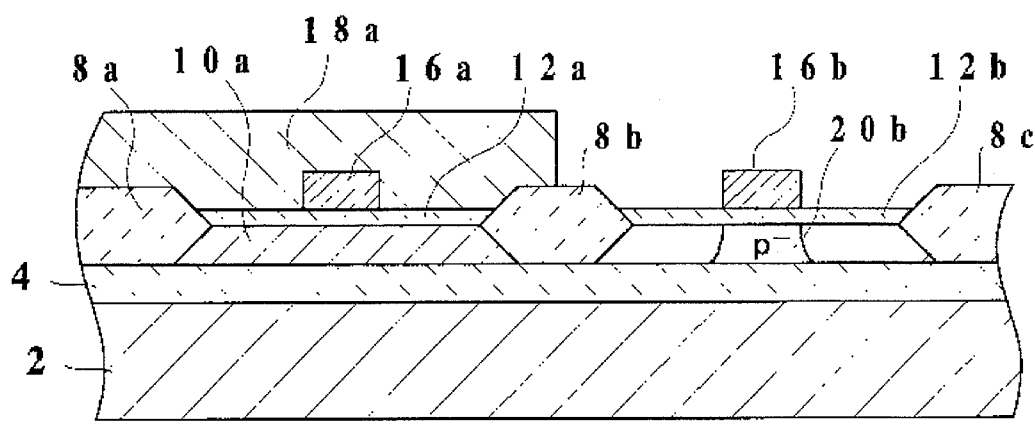
Figure 5:
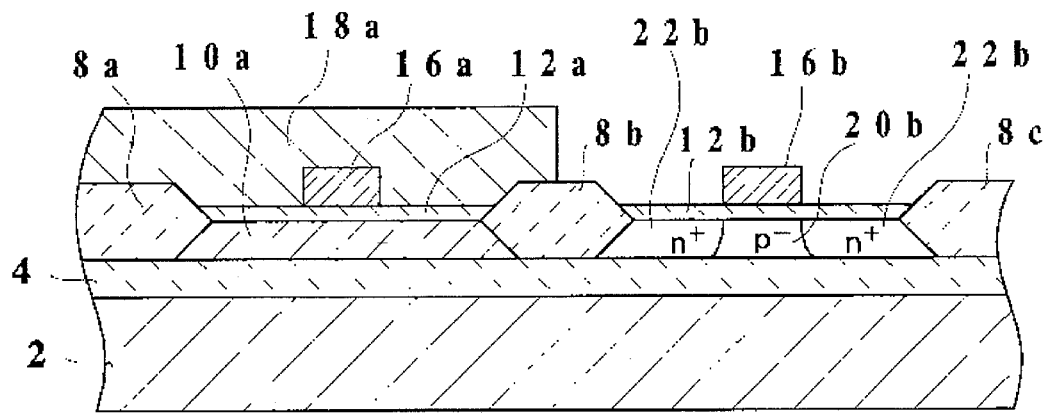

Referring to FIG. 5A, a resist pattern 18a masks the semiconductor area 10a. To form a channel region in the semiconductor area 10b, boron atoms of a first conductivity type are injected into the entire surface of the semiconductor area 10b. The boron atoms are implanted via a first beam so that the boron atoms which enter the gate electrode 16b pass through the gate electrode 16b and the gate oxidation layer 12b and just arrive at the semiconductor area 10b. For example, a beam of 150 KeV may be used. In the implantation step, the boron atoms which directly enter the gate oxidation layer 12b pass through the semiconductor area 10b and stay at the silicon oxide layer 4, and boron atoms which directly enter the field oxide layers 8a, 8b and 8c stay there. Therefore, boron atoms can be injected selectively into only the semiconductor area under the gate electrode. Referring to FIG. 5B, the substrate is subjected to a diffusion step to form a p- type channel region 20b.

Then, to form a source and a drain in the semiconductor area 10b, arsenic atoms of a second conductivity type are injected into the entire surface of the semiconductor area 10b. The arsenic atoms are implanted via a second beam so that the arsenic atoms which directly enter the oxidation layer 12b arrive at the semiconductor area except the semiconductor area under the gate electrode 16b. For example, a beam of 150 KeV may be used. In the implantation step, the arsenic atoms which directly enter the gate electrode 16b stay there, and the arsenic atoms which directly enter the field oxide layers 8a and 8b stay there.

Figure 6A:
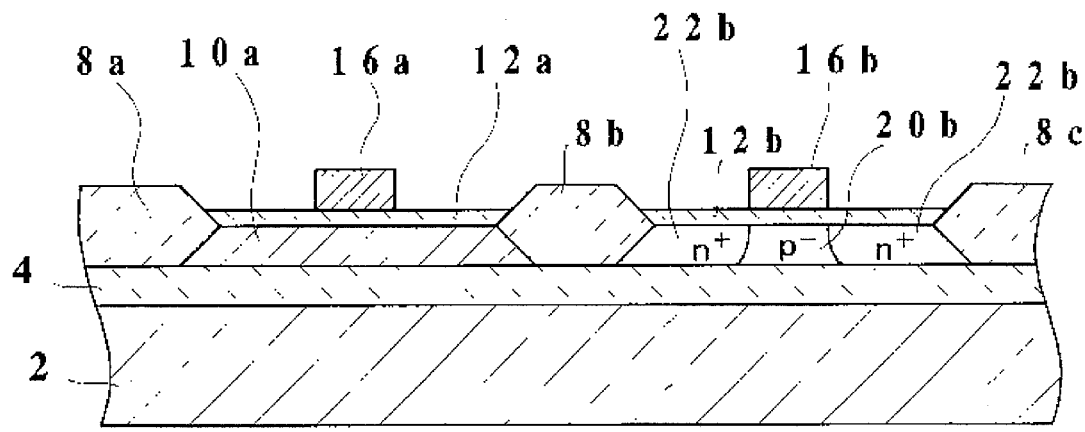
FIGS. 6A through 6C are schematic cross-sectional views showing a method for manufacturing an embodiment of the present invention.

Thus, the arsenic atoms are injected selectively into only the semiconductor area except the semiconductor area under the gate electrode 16b. Referring to FIG. 5C, the substrate is subjected to a diffusion step to form the N+ type source 22b and the N+ type drain 22b. Thereafter, the resist pattern 18a is removed (see FIG. 6A).

To form a PMOS type transistor in the semiconductor area 10a, the substrate is subjected to the following steps.

Figure 6B:
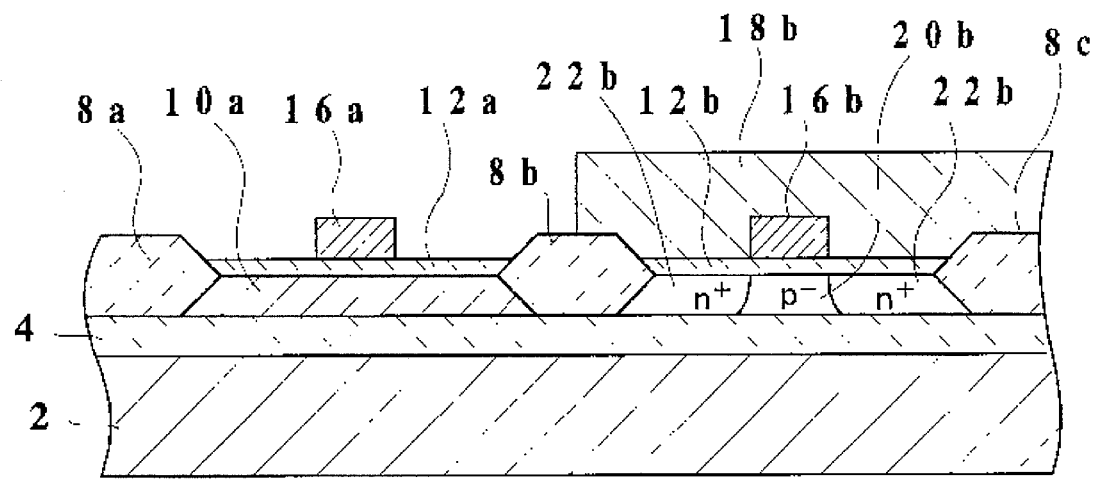

Referring to FIG. 6B, a resist pattern 18b masks the channel region 20b, the source 22b and the drain 22b of the NMOS type transistor. Thereafter, the substrate is subjected to an ion implantation step where boron atoms are implanted via a first beam so that the boron atoms which directly enter the gate electrode 16a pass through the gate electrode 16a and the gate oxidation layer 12b and just arrive at the semiconductor area 10a. For example, a beam of 150 KeV may be used. The boron atoms which directly enter the gate oxidation layer 12a pass through the semiconductor area 10a and stay at the silicon oxide layer 4. The boron atoms which directly enter the field oxide layers 8a and 8b stay at there.

Figure 6C:
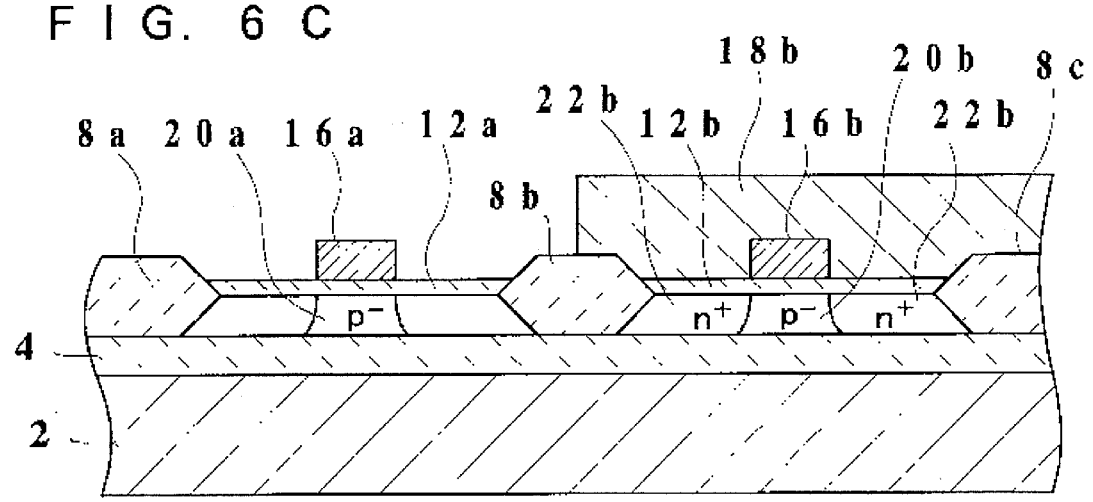

Thus, the boron atoms are injected selectively into only the semiconductor area under the gate electrode 16a. Referring to FIG. 6C, the substrate is subjected to a diffusion step to form the P-type channel region 20a.

Then, to form a source and a drain in the semiconductor area 10a, boron fluoride atoms of the second conductivity type are injected into the surface of the semiconductor area 10a. The boron fluoride ($BF_2$ ion) atoms are implanted via a second beam so that the boron fluoride atoms ($BF_2$ ion) which directly enter the oxidation layer 12a arrive at the semiconductor area except the semiconductor area under the gate electrode 16a. For example, a beam of 40 KeV may be used. The boron fluoride atoms which enter the gate electrode 16b stay there. The boron fluoride atoms which enter the field oxide layers 8a and 8b stay there.

Thus, the boron fluoride atoms are injected selectively into only the semiconductor area under the gate electrode 16a. Referring to FIG. 7A, the substrate is subjected to a diffusion step to form the P+ type source 22a and the P+ type drain 22a. The resist pattern 18b then is removed (see FIG. 7B).

Thereafter, an insulating layer 26 800 nm thick is formed on the entire surface of the substrate by a chemical vapor deposition technique using a material of boron phosphosilicate glass (BPSG). After the insulating layer 26 is etched to form a contact, a layer of aluminum silicon is deposited on the entire surface of the substrate and a wire line 28 of aluminum silicon is formed by etching the layer of aluminum silicon using a resist mask (see FIG. 7C).

Although in the preferred embodiment the SIMOX substrate is used as a SOI substrate, in alternative embodiments other substrates which are made by bonding a semiconductor substrate with the oxidized surface of a semiconductor substrate may be used.

Although in the preferred embodiment there is described a method for manufacturing the MOS type transistor of a semiconductor device, in alternative embodiments a method for manufacturing other semiconductor devices may be described.

Although in the preferred embodiment the ion implantation step of forming the source and the drain follows the ion implantation step of forming the channel region, in alternative embodiments an ion implantation step of forming the channel region follows an ion implantation step of forming the source and the drain.

Although in the preferred embodiment boron atoms are used as the first conductivity type atom and arsenic atoms are used as the second conductivity type atom, in alternative embodiments any other Group III element dopants may be used as the first conductivity type atom and any other Group V element dopants may be used as the second conductivity type atom.

As is described above in this embodiment according to the present invention, the boron atoms of the first conductivity type are implanted via a first beam so that the boron atoms which enter the gate electrode pass through the gate electrode and the gate oxidation layer and just arrive at the semiconductor area, thus injecting the boron atoms selectively into only the semiconductor area under the gate electrode.

Furthermore, the arsenic atoms of the second conductivity type are implanted via a second beam so that the arsenic atoms arrive at the semiconductor area except the semiconductor area under the gate electrode, thus injecting the arsenic atoms selectively into only the semiconductor area except the semiconductor area under the gate electrode.

Therefore, the channel region, the source and the drain for the transistor can be successively formed in the insulated semiconductor area using a single resist pattern as a mask.

In this embodiment, two ion implantation steps are successively performed in a single device, thereby saving time to manufacture the semiconductor device.

Although the invention has been described in its preferred form with a certain degree of particularity, it is understood that the present disclosure of the preferred form may be changed in the details of its construction and a broad variation in combination and arrangement of parts may be resorted to without departing from the spirit and the scope of the invention as hereinafter claimed.

What is claimed is:

1. A method of manufacturing a semiconductor device employing a SOI (semiconductor on insulator) substrate, the SOI substrate including a substrate and an insulation layer disposed on the substrate, said method comprising the steps of:

a) providing a semiconductor layer on the insulation layer;

b) forming a gate electrode over a first portion of the semiconductor layer;

c) masking portions of the semiconductor device in which no dopant is to be implanted and leaving unmasked other portions of the semiconductor device;

d) directing a beam of a first conductivity type at the unmasked portions of the semiconductor device such that the beam of the first conductivity type passes through the gate electrode to implant a first dopant in the first portion of the semiconductor layer under the gate electrode and such that the beam of the first conductivity type passes through a second portion of the semiconductor layer which does not underlie the gate electrode and reaches the insulation layer so that no first dopant is implanted in the second portion of the semiconductor layer; and e) directing a beam of a second conductivity type at the unmasked portions of the semiconductor device after the step of directing the beam of the first conductivity type such that the beam of the second conductivity type enters the second portion of the semiconductor layer which does not underlie the gate electrode to implant a second dopant in the second portion of the semiconductor layer and such that the gate electrode prevents the beam of the second conductivity type from entering the first portion of the semiconductor layer under the gate electrode so that no second dopant is implanted in the first portion of the semiconductor layer.

2. A method for manufacturing a semiconductor device according to claim 1,
   wherein the first conductivity type dopant is boron and the second conductivity type dopant is one of arsenic and boron fluoride ion.

3. A method for manufacturing a semiconductor device according to claim 1,
   wherein the first beam is of 150 KeV and the second beam is of 40 KeV.

4. A method of manufacturing a semiconductor device employing a SOI substrate, the SOI substrate including a substrate and an insulation layer disposed on the substrate, said method comprising the steps of:

a) providing a semiconductor layer on the insulation layer, the semiconductor laying having a first region in which a first circuit element is to be formed and a second region in which a second circuit element is to be formed;

b) forming a first gate electrode over a first portion of the first region of the semiconductor layer and a second gate electrode over a first portion of the second region of the semiconductor layer;

c) masking the second region of the semiconductor layer and the second gate electrode disposed thereon leaving unmasked the first region of the semiconductor layer and the first gate electrode disposed thereon;

d) directing a beam of a first conductivity type at the unmasked first region of the semiconductor layer and the first gate electrode disposed thereon such that the beam of the first conductivity type passes through the first gate electrode to implant a first dopant in the first portion of the first region of the semiconductor layer under the first gate electrode and such that the beam of the first conductivity type passes through a second portion first region of the semiconductor layer which does not underlie the first gate electrode and reaches the insulation layer under the first region of the semiconductor layer so that no first dopant is implanted in the second portion of the first region of the semiconductor layer;

e) directing a beam of a second conductivity type at the unmasked first region of the semiconductor layer and the first gate electrode disposed thereon after the step of directing the beam of the first conductivity type such that the beam of the second conductivity type enters the second portion of the first region of the semiconductor layer which does not underlie the first gate electrode to implant a second dopant in the second portion of the first region of the semiconductor layer and such that the first gate electrode prevents the beam of the second conductivity type from entering the first portion of the first region of the semiconductor layer under the first gate electrode so that no second dopant is implanted in the first portion of the first region of the semiconductor layer, thereby forming the first circuit element;

f) removing the mask from the second region of the semiconductor layer and the second gate electrode disposed thereon and masking the first region of the semiconductor layer and the first gate electrode disposed thereon, leaving unmasked the second region of the semiconductor layer and the second gate electrode disposed thereon;

g) directing a beam of a third conductivity type at the unmasked second region of the semiconductor layer and the second gate electrode disposed thereon such that the beam of the third conductivity type passes through the second gate electrode to implant a third dopant in the first portion of the second region of the semiconductor layer under the second gate electrode and such that the beam of the third conductivity type passes through a second portion second region of the semiconductor layer which does not underlie the second gate electrode and reaches the insulation layer under the second region of the semiconductor layer so that no third dopant is implanted in the second portion of the second region of the semiconductor layer; and h) directing a beam of a fourth conductivity type at the unmasked second region of the semiconductor layer and the second gate electrode disposed thereon after the step of directing the beam of the third conductivity type such that the beam of the fourth conductivity type enters the second portion of the second region of the semiconductor layer which does not underlie the second gate electrode to implant a fourth dopant in the second portion of the second region of the semiconductor layer and such that the second gate electrode prevents the beam of the fourth conductivity type from entering the first portion of the second region of the semiconductor layer under the second gate electrode so that no fourth dopant is implanted in the first portion of the second region of the semiconductor layer, thereby forming the second circuit element.

5. A method for manufacturing a semiconductor device according to claim 4, wherein the first conductivity type dopant is boron and the second conductivity type dopant is one of arsenic and boron fluoride ion.

6. A method for manufacturing a semiconductor device according to claim 5, wherein the first beam is of 150 KeV and the second beam is of 40 KeV.

* * * * *